(12) United States Patent
Naisby (10) Patent No.: US 8,404,402 B2
(45) Date of Patent: Mar. 26, 2013

(54) PHOTOPOLYMERISABLE SYSTEM FOR HOLOGRAM FORMATION

(75) Inventor: Andrew Naisby, Salzburg (AT)

(73) Assignee: Sony DADC Austria AG, Anif (AT)

( * ) Notice: Subject to any disclaimer, the term of this patent is extended or adjusted under 35 U.S.C. 154(b) by 334 days.

(21) Appl. No.: 12/729,696

(22) Filed: Mar. 23, 2010

(65) Prior Publication Data

US 2010/0248088 A1    Sep. 30, 2010

(30) Foreign Application Priority Data

Mar. 25, 2009    (EP) .................................... 09004277

(51) Int. Cl.
*G03H 1/02*    (2006.01)
(52) U.S. Cl. .......... 430/1; 430/2; 430/280.1; 430/281.1; 359/3
(58) Field of Classification Search ........................ None
See application file for complete search history.

(56) References Cited

U.S. PATENT DOCUMENTS

| | | | |
|---|---|---|---|
| 3,597,204 A * | 8/1971 | Rust .............................. | 430/292 |
| 3,598,684 A * | 8/1971 | Rust .............................. | 156/538 |
| 3,694,218 A | 9/1972 | Margerum et al. | |
| 4,173,474 A * | 11/1979 | Tanaka et al. .................... | 430/1 |
| 4,588,664 A * | 5/1986 | Fielding et al. ................... | 430/1 |
| 6,236,493 B1 * | 5/2001 | Schmidt et al. ................ | 359/296 |
| 6,706,355 B2 * | 3/2004 | Holguin et al. .............. | 428/40.1 |
| 2002/0110740 A1 * | 8/2002 | Otaki et al. ........................ | 430/1 |
| 2004/0132858 A1 | 7/2004 | Chisholm et al. | |
| 2005/0036179 A1 | 2/2005 | Chisholm et al. | |
| 2005/0159531 A1 * | 7/2005 | Ferng et al. .................... | 524/487 |
| 2006/0194121 A1 * | 8/2006 | Takizawa et al. ................. | 430/1 |

FOREIGN PATENT DOCUMENTS

| | | |
|---|---|---|
| EP | 0 302 829 A2 | 2/1989 |
| EP | 0 302 829 A3 | 2/1989 |
| EP | 302828 * | 2/1989 |
| EP | 1 231 511 A2 | 8/2002 |
| EP | 1 231 511 A3 | 8/2002 |
| WO | WO 2007/070092 A2 | 6/2007 |
| WO | WO 2007/070092 A3 | 6/2007 |
| WO | WO 2007/124459 A2 | 11/2007 |
| WO | WO 2007/124459 A3 | 11/2007 |

OTHER PUBLICATIONS

Hideo Tanigawa, et al., "Photopolymer for Recording Holograms", Journal of Photopolymer Science and Technology, vol. 14, No. 2, 2001, pp. 281-284.

* cited by examiner

*Primary Examiner* — Martin Angebranndt
(74) *Attorney, Agent, or Firm* — Oblon, Spivak, McClelland, Maier & Neustadt, L.L.P.

(57) ABSTRACT

A photopolymerizable system comprises an organic-inorganic compound with a metal and an organic unit having a organic photopolymerizable subunit capable of undergoing a polymerization, a support matrix compound being polymer or capable of forming a polymer upon polymerization, and a photoinitiator system adapted to initiate the polymerization of the photopolymerizable subunits. The molecules of the organic-inorganic compound are distributed on a molecular level in the photopolymerizable system.

17 Claims, 5 Drawing Sheets

PHOTOPOLYMERISABLE SYSTEM FOR HOLOGRAM FORMATION

An embodiment relates to a photopolymerisable system for forming a hologram and a recording composition with high photosensitivity and transparency.

BACKGROUND

Photopolymerisable systems may be used for hologram formation for applications related to security or data storage. Holograms formed with such photopolymerisable systems, e.g. in form of films, are for example volume holograms which may be realised as phase holograms. In these holograms the refractive index may be spatially modulated by an interference pattern of illuminating or exposing light sources—a writing or object beam and a reference beam. The spatially modulated variation in refractive index leads to a diffraction of a reading beam and the information encoded in the hologram may be identified upon the diffracted reading beam (reading).

The larger the gradient of the refractive index between the recorded and the adjacent lesser or non-recorded volumes caused by a corresponding refractive index modulation, the larger is the diffraction efficiency and the greater can be the clarity, brightness and definition of the final hologram.

There still lies a need for advanced materials for hologram formation with high diffraction efficiency, photosensitivity and/or transparency.

BRIEF SUMMARY

It is an object to provide a photopolymerisable system for forming a hologram and a hologram thereof.

This object is solved by photopolymerisable systems according to claims 1 to 12.

It is further an object to provide a method for forming a hologram.

This object is solved by a method according to claim 13.

Further details of embodiments will become apparent from a consideration of the drawings and ensuing description.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following, embodiments of the invention are described. It is to be noted that all described embodiments in the following may be combined in any way, i.e. there is no limitation that certain described embodiments may not be combined with others. Further, it should be noted that same reference signs throughout the figures denote same or similar elements.

It is to be understood that other embodiments may be utilised and structural or logical changes may be made without departing from the scope of the invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
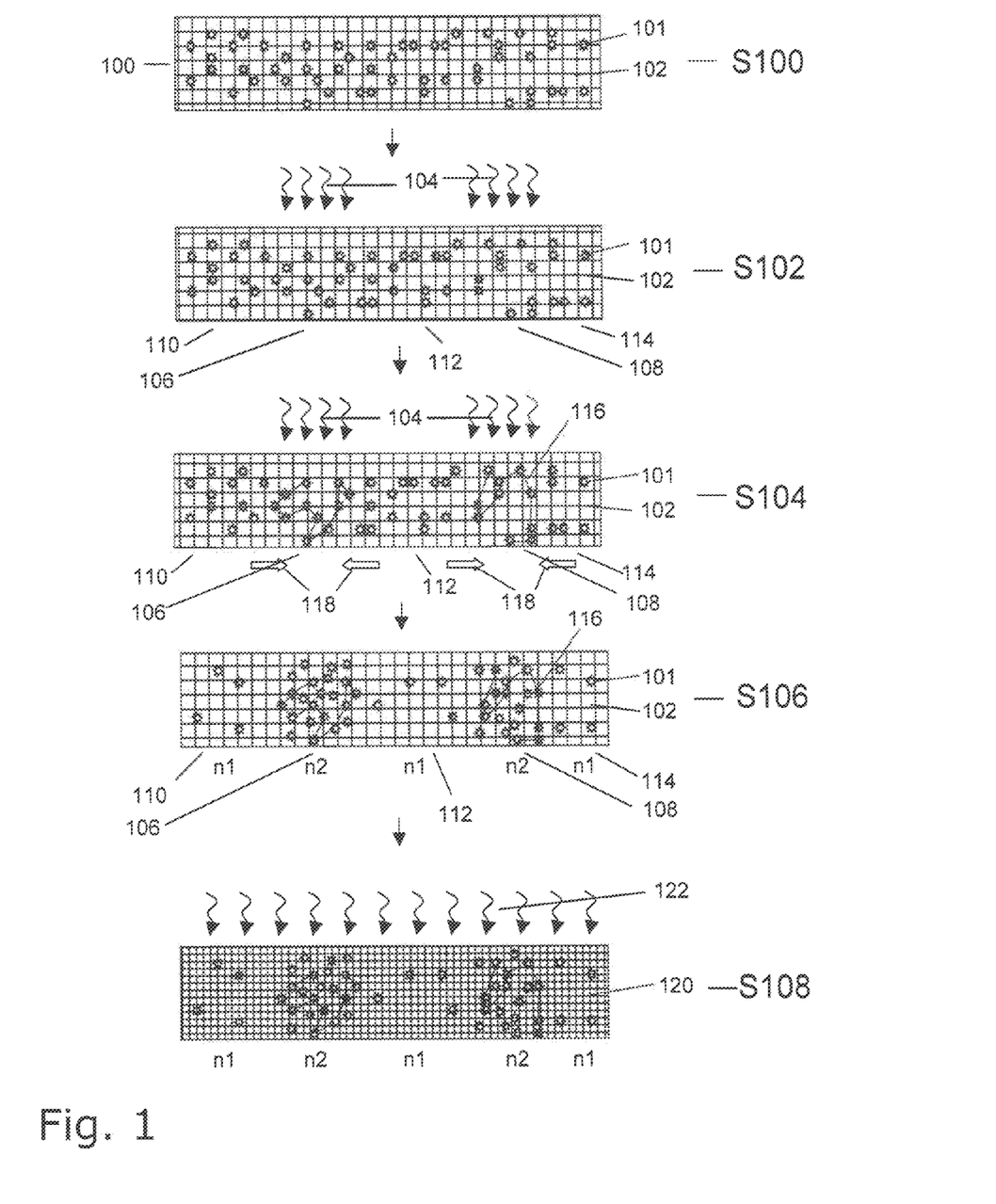
FIG. 1 schematically illustrates subsequent stages during formation of a hologram using a photopolymerisable system according to an embodiment.

FIG. 1 schematically illustrates subsequent stages during formation of a hologram using a photopolymerisable system 100 according to an embodiment. FIG. 1 depicts a cross section through a film or coating of the photopolymerisable system 100.

In an embodiment the photopolymerisable system 100 may include an organic-inorganic compound 101 with a metal and an organic unit having a photopolymerisable subunit capable of undergoing a polymerisation The organic-inorganic compound 101 is distributed on a molecular level in the photopolymerisable system 100. The photopolymerisable system 100 may further include a support matrix compound 102 being a polymer. The photopolymerisable system 100 furthermore may include a photoinitiator system (not illustrated in FIG. 1) adapted to initiate the polymerisation of the photopolymerisable subunits of the organic-inorganic compound 101.

In another embodiment the support matrix compound of the photopolymerisable system 100 may be a support matrix compound different than the organic-inorganic compound 101 and capable of forming a polymer upon polymerisation. Thus, the support matrix compound in this embodiment may be a monomer or a prepolymer. The support matrix compound may form the solid at room temperature upon polymerisation.

Throughout the document the term prepolymer and monomer is used as synonyms in that the meaning is that the prepolymer/monomer are still having reactive groups for a further polymerisation reaction.

Thus, a support matrix compound 102 being a polymer may be formed upon a polymerisation reaction of low molecular mass polymerisable monomers or prepolymers e.g. by light induced polymerisation, radical polymerisation, ionic polymerisation, polycondensation or any other polymerisation mechanism. This polymerisation reaction may be conducted in presence or absence of the organic-inorganic compound 101. However, the organic-inorganic compound 101 may not react during the polymerisation of the support matrix compound. The polymerisation of the support matrix compound may be conducted so that a polymeric support matrix compound 102 is generated.

The polymeric support matrix compound 102 may constitute a liquid or a solid phase.

The term solid has the meaning of a system that is keeping its shape if no external forces are applied and the physical dimensions are not defined by other elements such as walls. However, solid has as well the meaning of flexible systems for example gels. Solid is especially to be understood as non-liquid or gaseous.

As the polymeric support matrix compound 102 may be formed separately from the organic-inorganic compound 101 and the photoinitiator for the polymerisation of the organic-inorganic compound 101, the organic-inorganic compound 101 and the photoinitiator may be later added to the polymeric support matrix compound 102 for forming the photopolymerisable system 100.

The photopolymerisable system 100 may further include a solvent. Examples for suitable solvents are ketones, alcohols and esters such as methyl ethyl ketone, propanol, ethanol or ethyl acetate. These solvents may be fully or partially evaporated prior to the hologram recording at exposure stage S102.

The photopolymerisable system 100 may constitute a liquid phase or a gel phase in which the organic-inorganic compound 101 is soluble on a molecular level.

The photopolymerisable system 100 may have any level of viscosity/fluidity as long as the diffusion of the organic-inorganic compound 101 is possible. The photopolymerisable system may be a macroscopically and as well microscopically homogeneous system. However, the photopolymerisable system 100 may as well have microscopically inhomogeneous parts, as they are apparent for example in gels or porous systems.

As schematically illustrated in FIG. 1 at S100 the organic-inorganic compound 101 and the photoinitiator system may be homogeneously distributed in the support matrix compound 102. The liquid comprising the organic-inorganic compound 101 may as well be enclosing the support matrix compound 102 to cover the outer surface of the support matrix compound 102. The support matrix compound 102 may be a film or may be made of colloidal or particulate material or any other solid constitution.

The term surface of the support matrix compound 102 is throughout this document as well an inner surface e.g. of pores, openings or a like. It has the meaning of any surface area of the support matrix compound 102 which may exhibit an interaction with the organic-inorganic compound 101.

As the organic-inorganic compound 101 is molecularly distributed in the support matrix compound 102, it may exhibit a higher mobility than aggregated, clustered or particulate molecules or structures. This effect may be caused by the lower molecular mass of the organic-inorganic compound 102 in comparison to nanoparticles/clusters/aggregations of the molecules. Molecularly distributed has the meaning that at least 75% or even 90% of the molecules are not aggregated with other molecules of the same kind. The aggregation may be visible in spectroscopy or by scattering techniques. However, the meaning of aggregation is not the temporally limited proximity during diffusion.

As schematically illustrated in FIG. 1 at S102 the photopolymerisable system 100 is illuminated with light 104. An intensity of the light 104 may be varying over the volume of the photopolymerisable system 100. Some volumes 106, 108 may be illuminated with light having higher intensity and other volumes 110, 112, 114 may be illuminated with light having no or lower intensity. This spatial distribution may be generated by an interference pattern of two incident light beams. The light beams may be laser beams. The two beams may strike the sample of a photopolymerisable system 100 under any incident angle to the normal of the photopolymerisable system 100 surfaces and at any angle between the two incident beams.

Upon exposure the photoinitiator system is initiating a polymerisation of the photopolymerisable subunits of the organic-inorganic compound 101 forming a polymer network 116 at S104. The conversion of the organic-inorganic compound 101 monomer and/or prepolymer may be increased with larger intensities of light 104. The light source may be a laser. Thus, the spatial intensity pattern of the laser light is mapped into volumes 106, 108 due to the concentration gradients of the organic-inorganic compound 101 and the polymer network 116 formed thereof.

The photoinitiator system may be adapted to start upon illumination with light 104 a polymerisation with an ionic or radical polymerisation mechanism. The photoinitiator may initiate as well polymerisations of other mechanisms, for example polycondensation. The photoinitiator may be adapted to initiate the polymerisation upon exposure with light of the ultraviolet and visible spectrum. The term photoinitiator is used to describe any compound that initiates a reaction when exposed to electromagnetic radiation or other highly energetic species such as ionised gases (plasma).

The volumes 106, 108 in which the polymer network 116 may be predominantly formed may be extending in a direction parallel to the bisecting line of the angle between two incident beams. Therefore, if two beams, initiating the polymerisation of the subunits, are striking vertically from the same side on the surface of the photopolymerisable system 100 and parallel to each other, the volumes 106, 108, 110, 112, 114 may extend parallel to the surface normal of the photopolymerisable system 100. If two beams, initiating the polymerisation of the subunits, are striking vertically from the two different sides on the surface of the photopolymerisable system 100 and parallel to each other, the volumes 106, 108, 110, 112, 114 may extend vertically to the surface normal of the photopolymerisable system 100. The width of the volumes 106, 108 may be defined by the illumination beams, the conditions at exposure and/or the material of the photopolymerisable system 100.

The hologram formed upon the illumination of the photopolymerisable system 100 according to all embodiments may be known as a volume hologram, a phase hologram, a full colour hologram, a transmission or a reflection hologram.

As a result of the polymerisation of the organic-inorganic compound 101, at S104 the concentration of the organic-inorganic compound 101 is reduced in the illuminated volumes 106, 108 and a concentration gradient is created between the illuminated volumes 106, 108 with a lower concentration of organic-inorganic compound 101 and the adjacent non-illuminated volumes 110, 112, 114 having a higher concentration of the organic-inorganic compound 101. This concentration gradient is illustrated at S104 leading to a directed diffusion 118 of the organic-inorganic compound 101 from the non-illuminated volumes 110, 112, 114 to the illuminated volumes 106, 108.

As it is an objective to generate a hologram with a high diffraction efficiency, the refractive index gradient of the diffraction index between the illuminated and non-illuminated volumes shall be large and it is, therefore, an objective to provide a photopolymerisable system capable of forming holograms with a large refractive index difference gradient between the illuminated volumes 106, 108 and the non-illuminated volumes 110, 112, 114 and holograms thereof.

The difference in the refractive index in the illuminated volumes 106, 108 in comparison to the non-illuminated volumes 110, 112, 114 may be dominated by the concentration of the organic-inorganic compound 101 and the polymer network 116 formed thereof. This is illustrated in FIG. 1 at S106 in that the volumes 106, 108 have a refractive index n2 different from that of the non-illuminated or less illuminated volumes 110, 112, 114 having a refractive index n1. As described above, at S106 the organic-inorganic compound in form of the organic-inorganic compound 101 and the polymer network 116 formed thereof may have a higher concentration in the illuminated volumes 106, 108 than in the non-illuminated or less illuminated volumes 110, 112, 114 due to the polymerisation and the diffusion. Thus, for example, if the organic-inorganic compound 101 and the polymer network 116 formed thereof may have a high refractive index, the volumes 106, 108 exhibit a high refractive index n2 and the non-illuminated or less illuminated volumes 110, 112, 114 exhibit a low refractive index n1. Thus, a refractive index difference has been generated leading to a diffraction of a reading beam with a diffraction efficiency proportional to the gradient between the refractive indices of the illuminated volumes 106, 108 and the non-illuminated volumes 110, 112, 114.

It is noted that throughout this document the term volume is not restricting to a precisely defined volume with clearly defined enclosures. Thus, even though continuous changes of properties may be apparent between the first and the second volumes, e.g. the concentration gradient, it is the characteristic of a comparable volume, which shall be considered properties of the volumes.

The refractive index gradient may be increased through the interaction of the organic-inorganic compound molecules 101 and the polymeric support matrix compound 102. The interaction between the polymeric support matrix compound 102 and the organic-inorganic compound 101 alters the mobility of the organic-inorganic compound 101. This alteration may be combined with no loss of the rigidity, integrity and heat resistance of the final hologram. In fact, it may serve to enhance these properties.

Thus, by selecting the chemical composition of the support matrix compound 102 the interaction, e.g. the electrostatic forces or the complexing capabilities, with the organic-inorganic compound 101 may be selected and thus the mobility, diffusion and/or concentration gradient of the organic-inorganic compound 101 may be adjusted, e.g. maximized.

Attractive interaction or repulsive interactions between the support matrix compound 102 and the organic-inorganic compound 101 may have the effect of a higher solubility of the organic-inorganic compound 102 on the molecular level in the photopolymerisable system 100.

For photopolymerisable systems 100 in a gel phase the mobility may also be influenced by the fluidity of the gel prior to exposure, dependant on the ratio of organic-inorganic compound 101 to the support matrix compound 102.

In an embodiment the organic-inorganic compound 101 may have a high refractive index. Additionally, the interaction between the support matrix compound 102 and the organic-inorganic compound 101 may be attractive. The attractive interaction may be apparent using a support matrix compound 102 with a covalently bound charge or a covalently bound partial charge on the surface of the support matrix compound 102, as the organic-inorganic compound 101 may have a zeta potential with a opposite algebraic sign of the charge of surface of the support matrix compound 102. The interaction may further be hydrogen bonding, electronic interactions such as pi:pi attractive forces, Van der Waals or London dispersion forces. The support matrix compound 102 may be doped, for example with metal ions or atoms to form complexes with the organic-inorganic compound 101.

Therefore, the support matrix compound 102 may have any one of species of the group comprising a covalently bound ionic group, a polar group, a hydrogen bond forming group and a metal atom forming a complex with an aromatic ring of the support matrix compound 102 and the species may be adapted to exhibit attractive forces on the organic-inorganic compound 101.

For example the organic-inorganic compound 101 may have a positively charged metal atom, which may result in a positive zeta potential. Depending on the sub-units of the organic-inorganic compound 101, the organic-inorganic compound 101 may have a positively charged metal atom and a negative zeta potential. These are examples of electrostatic forces that influence mobility and diffusion.

Figure 2:
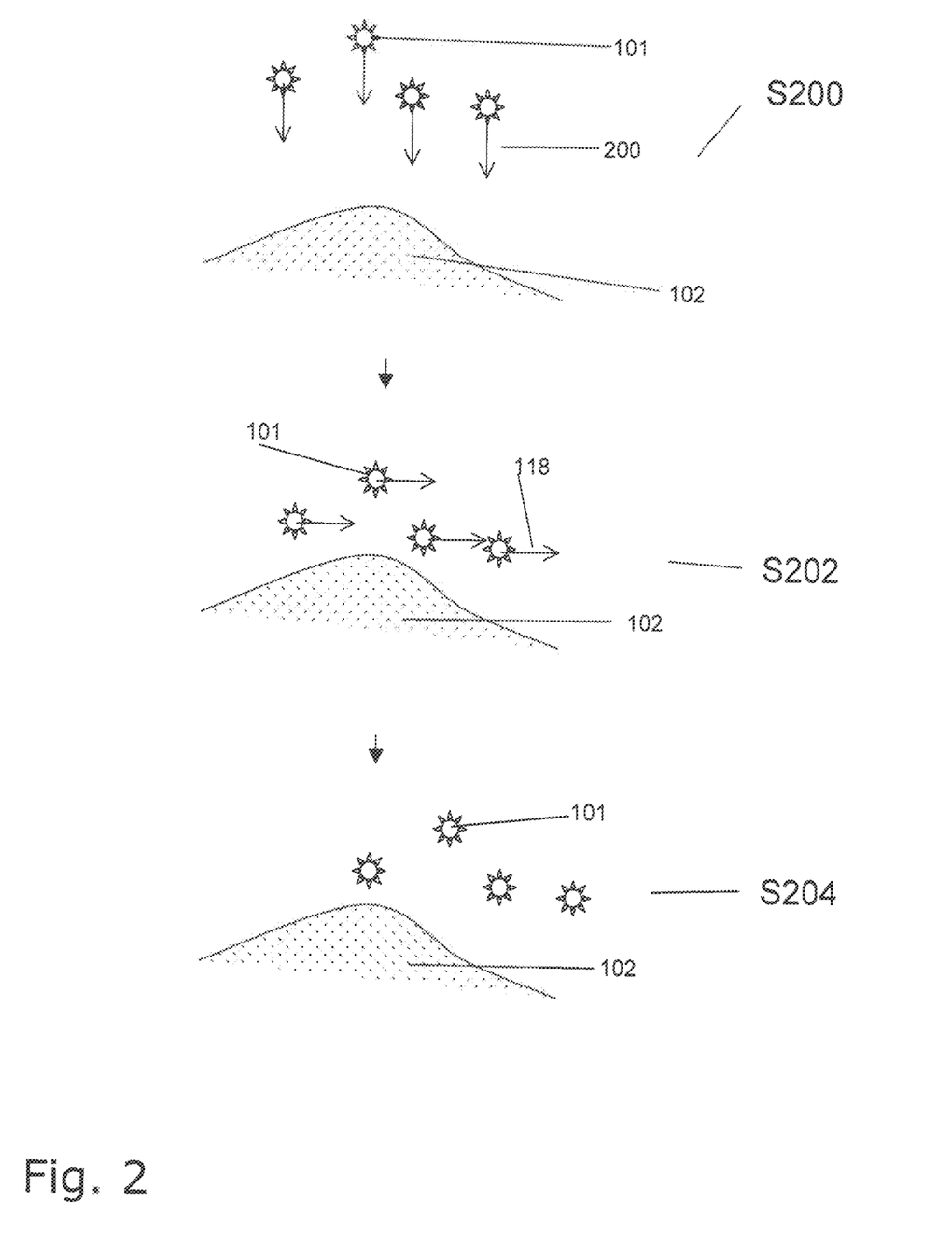
FIG. 2 schematically illustrates the effect of an attractive interaction of a support matrix compound and an organic-inorganic compound.

In FIG. 2 a further mechanism than the increased solubility for the increased mobility is schematically illustrated. At S200 the organic-inorganic compound 101 may be attracted to the surface of the support matrix compound 102. After generation of a concentration gradient such as at S104 in FIG. 1, the organic-inorganic compound 101 diffuses correspondingly along the surface of the support matrix compound 102 as it is schematically illustrated at S202. This diffusion 118 may lead to a corresponding displacement of the organic-inorganic compound 101 as it is schematically illustrated at S204.

Figure 3:
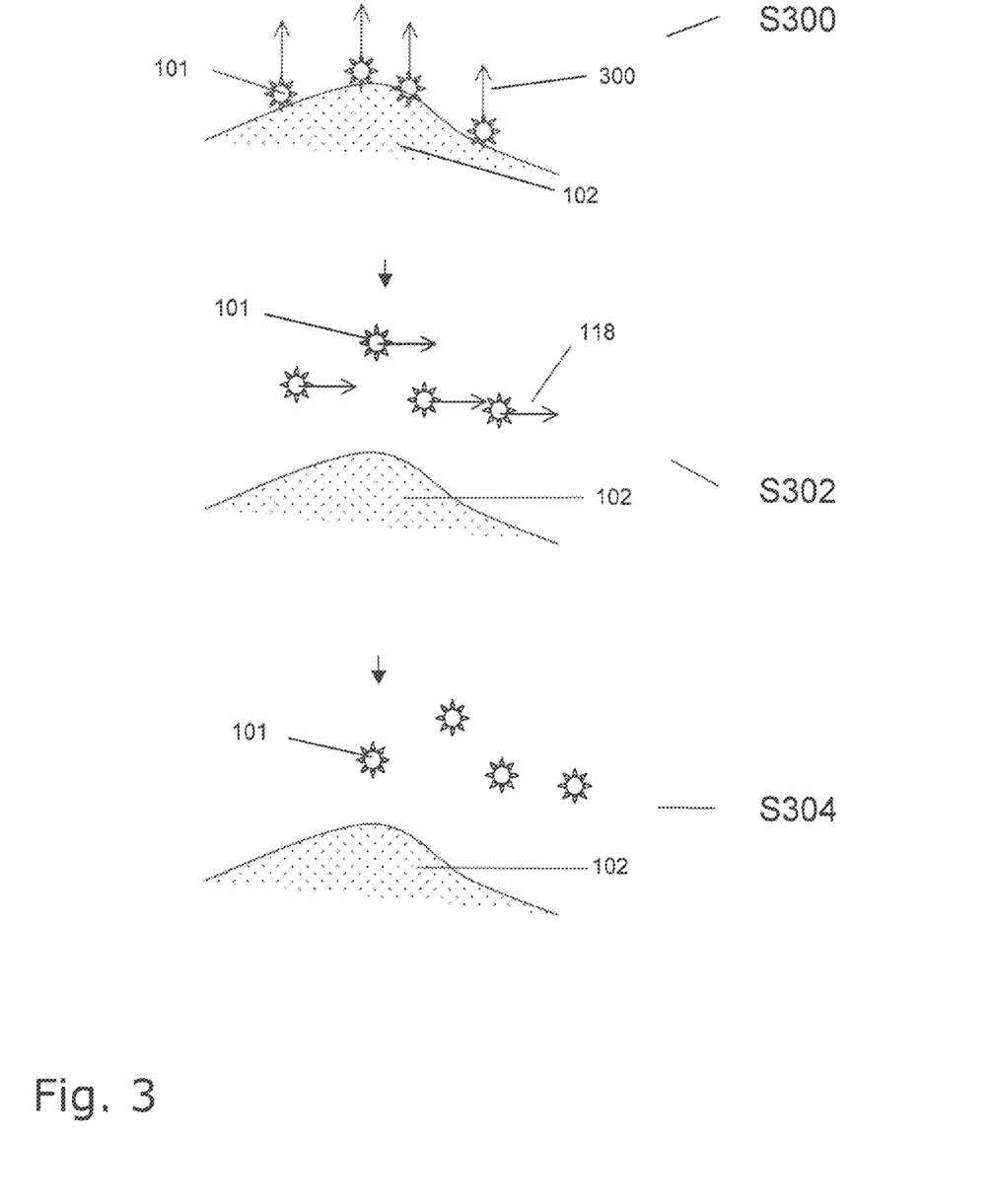
FIG. 3 schematically illustrates the effect of a repulsive interaction of a support matrix compound and an organic-inorganic compound.

In another embodiment the organic-inorganic compound 101 may have a high refractive index. The interaction between the support matrix compound 102 and the organic-inorganic compound 101 may be a repulsive interaction. In FIG. 3 at S300 it is schematically illustrated that such a repulsive interaction may cause the organic-inorganic compound 101 to move away 300 from the surface of the support matrix compound 102, thus reducing the tendency of absorption. Thus, as it is schematically illustrated at S302, by means of the repulsive interaction the organic-inorganic compound 101 may stay in the liquid phase allowing for the diffusion 118 upon a concentration gradient as it is illustrated at S104 in FIG. 1. This diffusion 118 may lead to a corresponding displacement of the organic-inorganic compound 101 as it is schematically illustrated at S304.

In an embodiment the repulsive force on the organic-inorganic compound 101 may be achieved by using a support matrix compound 102 having any one of species of the group comprising a covalently bound ionic group, a polar group and a hydrogen bond forming group.

In an embodiment the repulsive interaction may be apparent using a support matrix compound 102 with a covalently bound charge or a covalently bound partial charge on the surface of the support matrix compound 102, as the organic-inorganic compound 101 may have a zeta potential with a like algebraic sign of the charge of surface of the support matrix compound 102.

For example the organic-inorganic compound 101 may have a positively charged metal atom, which may result in a positive zeta potential. Depending on the sub-units of the organic-inorganic compound 101, the organic-inorganic compound 101 may have a positively charged metal atom and a negative zeta potential. These are examples of electrostatic forces that influence mobility and diffusion.

It is noted that the interaction between the support matrix compound 102 and the organic-inorganic compound 101 may be attractive or repulsive to increase the mobility of the organic-inorganic compound 101.

A hologram formed with a photopolymerisable system 100 may further include non-polymerised and/or reduced organic-inorganic compound 101 wherein a metal ion is precipitated to the pure metal.

Further, the attractive or repulsive interaction between the support matrix compound 102 and the organic-inorganic compound 101 may have an effect on the orientation of the organic-inorganic compound 101 or the polymer network 116 formed thereof in the recorded hologram. This orientation may cause an refractive index modulation. Corresponding holograms may have an increased correlation of the orientation of the organic-inorganic compound 101 or the polymer network 116 formed thereof for example an increased proximity, an increased crystallinity a stacking, or a reduction of the metal in the organic-inorganic compound 101 to metal atoms.

Thus, holograms made of the photopolymerisable systems 100 may exhibit a correlation of the orientation of the organic-inorganic compound 101 or the polymer network 116 formed thereof, which may not be apparent to the same extent without the interaction to the support matrix compound 102. As this correlation of orientation may alter the refractive index in illuminated volumes 106, 108 with higher concentration of the organic-inorganic compound 101 and the polymer network 116 in comparison to the refraction index in non-illuminated or less illuminated volumes 110, 112, 114 with lower concentration of the organic-inorganic compound 101 and the polymer network 116, the diffraction efficiency may be increased with photopolymerisable systems 100 as described in the following embodiments and corresponding holograms may be formed.

As schematically illustrated in FIG. 1 at S108 the hologram formation may include further a curing step. The refractive index modulation caused by the aforementioned described correlation of orientation may be further increased by this post-processing step S108. After curing at S108 such a hologram may have a higher correlation of orientation. Further such a hologram 120 may be hardened and its lifetime and durability may be enhanced. This may be conducted by UV or visible light irradiation 122, thermal curing or plasma treatment, wherein the complete hologram is exposed to UV light and/or visible light and thermally treated and/or exposed to plasma. Upon this treatment non-reacted polymerisable groups of the organic-inorganic compound 101 and/or the polymer network 116 and/or the support matrix compound 102 may react by further polymerizing and cross linking and therefore forming a more stable hologram, in which the refractive index change may be further fixed. During the curing step S108 as well other non reacted polymerisable groups of the photopolymerisable system may polymerise and cross link.

Thus, the photopolymerisable system 100 may further include any commonly known UV photoinitiator that absorbs in the UV light region, any commonly known visible light photoinitiator that absorbs in the visible light region, any commonly known thermal initiator adapted to initiate a polymerisation or crosslinking; or simply thermal treatment is used to change the physical form, such as fusing. Examples for the UV photoinitiator are benzophenones, alpha-hydroxy ketones, alpha-amino ketones, phenyl glyoxalates, thioxanthones, phosphine oxides and the like. Oxime esters are further examples of the UV photoinitiator especially suited to cure semi-solid or solid state surface coatings or highly coloured formulations because the initiating radicals produced have extended lifetimes. Their use as photoinitiators to complete polymerisation during the UV curing or fixing process is particularly preferred.

Depending on the polymerisable groups which react during the curing at S108 the UV photoinitiator or thermal initiator may be adapted to initiate a ionic or radical polymerisation or any other polymerisation mechanism.

Holograms formed with a photopolymerisable system 100 may further include non-polymerised and/or reduced organic-inorganic compound 101 wherein a metal ion is precipitated to the pure metal.

The support matrix compound 102 may be any of the described support matrix compound 102 providing it exhibits attractive or repulsive forces on the organic-inorganic compound 101.

It is noted that the two effects of the electrostatic interaction—altering the mobility and altering the orientation correlation—may both or only one thereof apparent in a photopolymerisable system 100 for every combination of possible materials.

Figure 4:
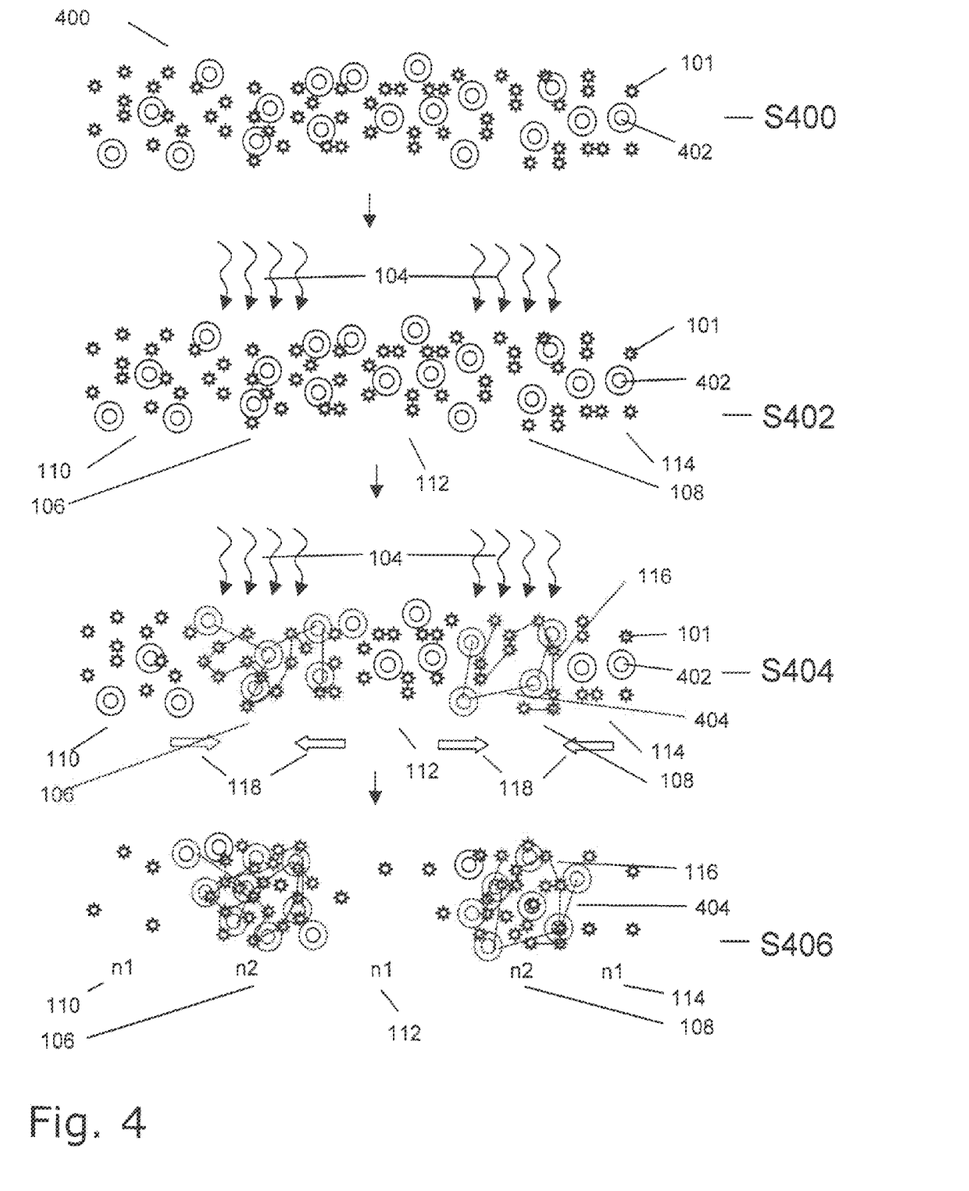
FIG. 4 schematically illustrates subsequent stages during formation of a hologram using a photopolymerisable system according to an embodiment.

In FIG. 4 another embodiment is schematically illustrated. In this embodiment both, the support matrix compound 402 and the organic-inorganic compound 101, are predominantly polymerised corresponding of the interference pattern of an object beam and a reference beam. The refractive index modulation may be further enhanced by the interaction between the polymerized support matrix compound 402 in the illuminated volumes and the organic-inorganic compound 101.

The photopolymerisable system 400 according to the embodiment illustrated in FIG. 4 may include a high refractive index organic-inorganic compound 101 with a metal and an organic unit having a photopolymerisable subunit capable of undergoing a polymerisation, which is distributed on a molecular level in the photopolymerisable system 400, and a support matrix compound 402 capable of forming a polymer upon polymerisation and being different from the organic-inorganic compound. Further, the photopolymerisable system 400 may include a photoinitiator system adapted for initiating the polymerisation of the photopolymerisable subunits of the organic-inorganic compound 101 (not illustrated in FIG. 4). The photoinitiator system may as well be adapted to initiate the polymerization of the support matrix compound 402. The system may include another photoinitiator system adapted for initiating the polymerization of the support matrix compound 402.

Principles of formation of the hologram at S400, 5402, 5404, and 5406 correspond to S100, S102, S104 and S106 in FIG. 1. Thus, only the differences will be described below.

The support matrix compound 402 may be a monomer, preferably a prepolymer and may exhibit the functionality as binder or a solid support matrix compound after being polymerised, crosslinked or fused.

During spatially varying illumination with light 104, as schematically illustrated in S402, the support matrix compound 402 may be polymerised forming a polymer 404 of higher molecular weight. The polymer network 116 of the organic-inorganic compound 101, which may be formed at the same step S402, and the polymer 404 may constitute separate polymer chains as illustrated at S404. The support matrix compound 402 and the organic-inorganic compound 101 may alternatively constitute together one copolymer in that during the polymerisation the subunits of the organic-inorganic compound 101 and the support matrix compound 402 react with each other.

Upon illumination, schematically illustrated at S404, a concentration gradient of the organic-inorganic compound 101 may be generated, leading to the diffusion 118 of the organic-inorganic compound 101 from the non-illuminated volumes to the illuminated volumes. Thus, in the hologram 406 a refractive index difference between the illuminated volumes having a refractive index n2 and the non-illuminated volumes having a refractive index n1 may be apparent as schematically illustrated at S406.

In this embodiment attractive interaction between the polymerised support matrix compound 404 and the organic-inorganic compound 101 may lead to an increased diffusion of organic-inorganic compound 101 in the illuminated volumes in comparison to a system formed upon the same photopolymerisable system 400 not including the support matrix compound 402.

The attractive interaction may be exhibited using a support matrix compound 402 which forms a polymer 404 with a covalently bound charge or a covalently bound partial charge on the surface, as the organic-inorganic compound 101 may have a zeta potential with an opposite algebraic sign to the charge of the surface charge of the polymer 404 or the co-polymer. Nonetheless the interaction may be hydrogen bonding, electronic interactions such as pi:pi attractive forces, Van der Waals or London dispersion forces. Furthermore, the support matrix compound 402 may be doped with metal ions or atoms to form complexes with the organic-inorganic compound 101.

Therefore, the support matrix compound 402 of the photopolymerisable system 400 may be adapted to have on the surface of the polymerised support matrix compound 404 any one of species of the group comprising a covalently bound ionic group, a polar group, a hydrogen bond forming group and a metal atom forming a complex with an aromatic ring of the support matrix compound 402 and the species may be adapted to exhibit attractive forces on the organic-inorganic compound 101.

In this embodiment the attractive forces may be exhibited in that a fraction of the organic-inorganic compound 101 may be absorbed on the surface of the polymer 404 or the co-polymer. This absorption may lead to an increased concentration gradient of the organic-inorganic compound 101 between illuminated and non-illuminated volumes.

After the diffraction grating has been formed, in a curing step non-reacted polymerisable units may be further polymerised by a full volume UV exposure or a thermal treatment or a plasma treatment and any combination thereof. This step corresponds to step 108 in FIG. 1.

The support matrix compound 402 may be any of the described support matrix compound which are or form the polymers or copolymers that exhibits attractive forces in the polymerised state on the organic-inorganic compound 101.

Figure 5:
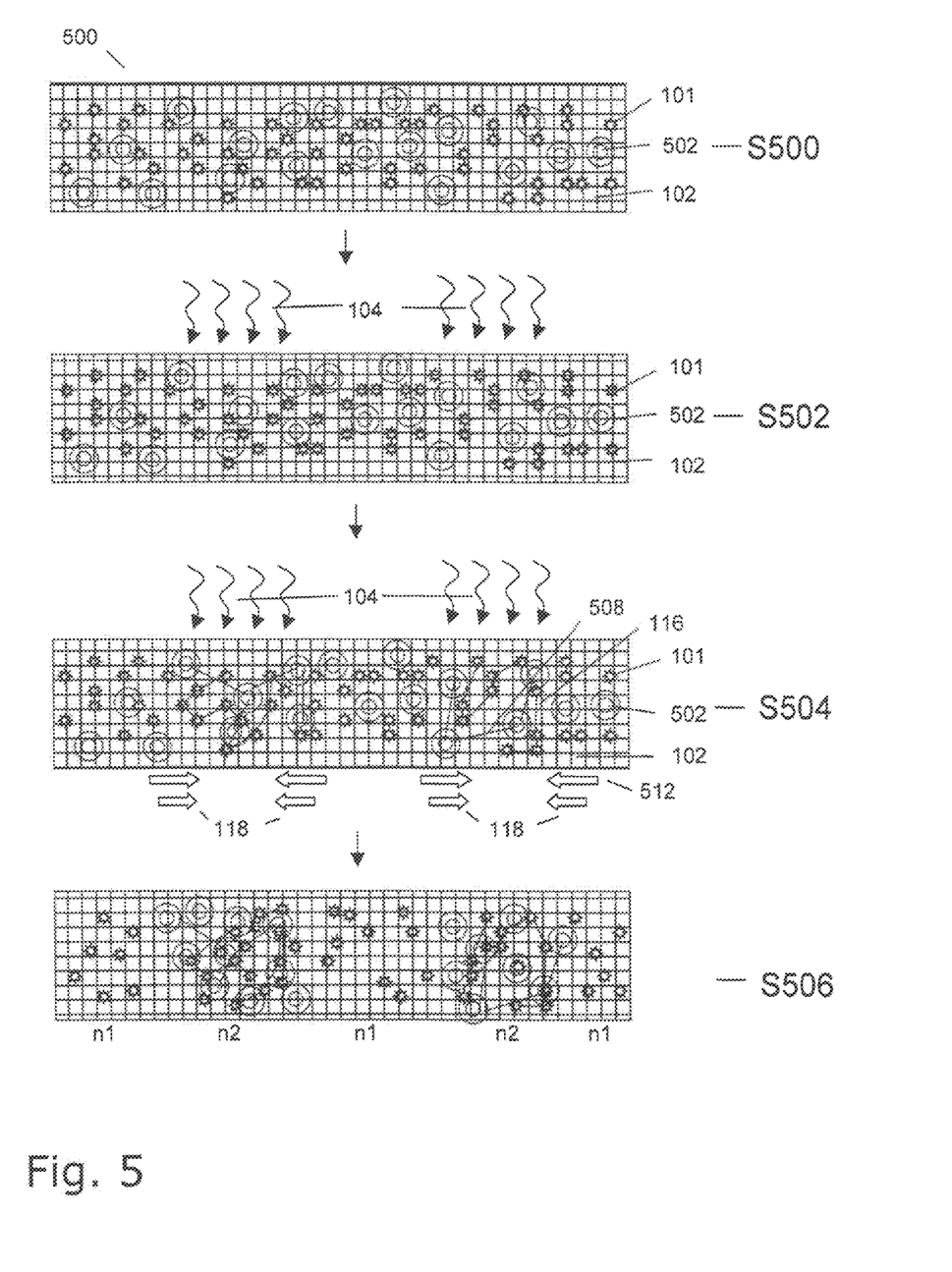
FIG. 5 schematically illustrates subsequent stages during formation of a hologram using a photopolymerisable system according to an embodiment.

FIG. 5 schematically illustrates yet another embodiment. In this embodiment both, a further prepolymer 502 and the organic-inorganic compound 101, are predominantly polymerised corresponding of the interference pattern of an object beam and a reference beam.

The photopolymerisable system 500 includes an organic-inorganic compound 101 with a metal and an organic unit having a photopolymerisable subunit capable of undergoing a polymerisation. The organic-inorganic compound 101 is distributed on a molecular level. The photopolymerisable system 500 may further comprise a prepolymer 502 different from the organic-inorganic compound 101. The prepolymer 502 is including a photopolymerisable subunit capable of undergoing a polymerisation. The photopolymerisable system 500 further may include a support matrix compound 102 being a polymer. Further the photopolymerisable system 500 may include a photoinitiator system for initiating the polymerisation of the photopolymerisable subunits of the organic-inorganic compound 101. The photoinitiator system may as well initiate the polymerisation of the prepolymer 502. The system may include another initiator system for initiating the polymerisation of the prepolymer 502.

The organic-inorganic compound 101, the prepolymer 502 and the photoinitiator system may be homogeneously distributed in the support matrix compound 102 at S500. A liquid including the organic-inorganic compound 101, the prepolymer 502 and the photoinitiator may as well be enclosing the support matrix compound 102 to cover the outer surface of the support matrix compound 102. The support matrix compound 102 may be a film or may be made of colloidal or particulate material or have any other solid constitution.

As the organic-inorganic compound 101 is molecularly distributed in the support matrix compound 102, it may exhibit a high mobility in comparison to aggregated or clustered molecules, which show smaller diffusion coefficients.

Corresponding to the embodiments described above, the support matrix compound 102 may be alternatively any precursor of a solid support matrix compound 102 which may be adapted to form a polymer upon polymerisation or crosslinking.

Principles of formation of the hologram at S500, S100, S502, and S102 correspond to S100, S102, S104 and S106 in FIG. 1. Thus, only the differences will be described.

Upon illumination with light 104, schematically illustrated at S502 and S504, the prepolymer 502 may be polymerised, thus the system created at this step may constitute a polymer 508, and the organic-inorganic compound 101 may be polymerised, thus the system created at this step may constitute a polymer network 116. Alternatively, the organic-inorganic compound 101 and the prepolymer 502 may copolymerize, thus the system created at this step may constitute a copolymer.

Upon illumination a concentration gradient of the organic-inorganic compound 101 and a concentration gradient of the prepolymer 502 may be formed and the diffusion 118 of the organic-inorganic compound 101 and the second diffusion 512 of the prepolymer 502 may be induced.

Table 1 illustrates combinations of properties of corresponding photopolymerisable systems 500 having high diffraction efficiency.

In a first combination a first refractive index of the organic-inorganic compound 101 or the polymer network 116 formed thereof may be higher than a second refractive index of the prepolymer 502 or the polymer 508 formed thereof. The diffusion coefficient of the organic-inorganic compound 101 may be higher than the diffusion coefficient of the prepolymer 502. The diffusion coefficient difference may further be larger in the photopolymerisable system 500 than in the corresponding system without the support matrix compound 102.

In second combination the first refractive index and the second refractive index may be higher than a refractive index of the support matrix compound 102. The diffusion coefficient of the organic-inorganic compound 101 and the diffusion coefficient of the prepolymer 502 may be larger in the photopolymerisable system 500 than in the corresponding system without the support matrix compound 102.

In a third combination the first refractive index may be lower than the second refractive index. The diffusion coefficient of the organic-inorganic compound 101 may be lower than the diffusion coefficient of the prepolymer 502. The diffusion coefficient difference may further be larger in the photopolymerisable system 500 than in the corresponding system without the support matrix compound 102.

Therefore, in embodiments corresponding to the three combinations the support matrix compound 102 may have any one of species of the group comprising a covalently bound ionic group, a polar group, a hydrogen bond forming group and a metal atom forming a complex with an aromatic ring of the support matrix compound and the species may be adapted to exhibit attractive forces on the organic-inorganic compound 101.

Alternatively, in embodiments corresponding to the three combinations the support matrix compound 102 may have any one of species of the group comprising a covalently bound ionic group, a polar group and a hydrogen bond forming group and the species may be adapted to exhibit repulsive forces on the organic-inorganic compound 101.

The organic-inorganic molecules 101 compound may have a chemical structure with only one metal atom.

A metal atom of the organic-inorganic compound 101 may be coordinated by an organic subunit. The coordination may be a covalent bond or a complexing dative covalent bond rendering a compound that is soluble in polar solvents.

TABLE 1

Exemplary combinations of properties of photopolymerisable systems 500 having a large diffraction efficiency

| | Combination 1 | Combination 2 | Combination 3 |
|---|---|---|---|
| Refractive index of organic-inorganic compound 101 and polymer 116 thereof | Higher refractive index than refractive index of pre-polymer and polymer thereof | Higher refractive index than support matrix compound | Lower refractive index than refractive index of pre-polymer and polymer thereof |
| Refractive index of prepolymer 502 and polymer 508 thereof | Lower refractive index than refractive index of organic-inorganic compound and polymer thereof | Higher refractive index than support matrix compound | Higher refractive index than refractive index of organic-inorganic compound and polymer thereof refractive index |

In the described embodiments the organic-inorganic compound 101 may include one of the group of metallic acrylate, zinc diacrylate, a zinc containing polyester acrylate, zirconium bromonorbornanelactone carboxylate triacrylate, hafnium carboxyethylacrylate, zirconium dinorbornane carboxylate diacrylate, zirconium carboxyethylacrylate or any mixture of any of these compounds.

As an example, zinc diacrylate may be the organic-inorganic compound 101 having a low refractive index and zirconium bromonorbornanelactone carboxylate tracrylate, hafnium carboxyethylacrylate, zirconium carboxyethylacrylate may be the organic-inorganic compound 101 having a high refractive index.

The photopolymerisable subunit may include any polymerisable functional group consisting of ethylenically unsaturated functional groups, cyclical groups, NCO groups, amines or OH-groups in combination with carboxylic groups. The photopolymerisable subunit may include more than one polymerisable functional group. The photopolymerisable subunit may further include highly polar groups such as substituted aromatic rings, carboxylic groups, halogens, e.g. Cl, Br.

The organic-inorganic compound 101 may further include more than one photopolymerisable subunit and the organic-inorganic compound 101 may include photopolymerisable subunits of same or different kinds.

The organic-inorganic compound 101 may include non-polymerisable subunits. For example the organic-inorganic compound 101 may include subunits, which are adapted to generate a high refractive index. Examples are highly polar sub-units.

In the described embodiments the organic-inorganic compound 101 may include any metal of the group of alkali metals, alkaline earth metals, transition elements or other metals. Electronegativity and/or possible coordination number and/or a size of the transition metals may lead for organic-inorganic compounds 101 including a transition metal to a molecular solvability and may lead to the effect of a molecular solvability without dissociation in the liquid phase. Further the diffraction efficiency of holograms generated with an organic-inorganic compound 101 including a transition metal may further be increased through a higher refractive index of the transition elements in comparison to a corresponding alkali and alkaline earth metal containing organic-inorganic compounds in a pre-defined wavelength range of light. Examples of transition metals are zinc, zirconium, or hafnium.

The organic-inorganic compound 101 may have the following structures:

(I)

(II) with n+m=4 and n between 1 and 4 and m between 1 and 4

(III)

High refractive index organic-inorganic compounds 101 may have refractive indices above 1.6. After a curing step the refractive index may be above 1.8.

The support matrix compound 102, 402 may be an organic polymer or a precursor, a prepolymer or a monomer thereof.

To induce attractive or repulsive forces to influence the mobility and/or induce the correlation of the orientation the support matrix compound 102, 402 may be capable having electrostatic interaction with the organic-inorganic compound 101. The support matrix compound 102, 402 may be formed of polymers including ionic or polar groups. Examples are COOH, PO$_3$H$_2$, SO$_3$H, SO$_2$NHSO$_2$SO$_2$NHCO, NH$_4$+, CONH and the like. Examples of support matrix compound are maleate resins, polymers of β-methacryloyloxy-ethyl N-(p-tolyl-sulfonyl)-carbamate and copolymers of these and similar monomers with other monomers, styrene/maleic acid anhydride copolymers, copolymers of alkylmethacrylate and methacrylic acid and copolymers of methacrylic acid, alkylmethacrylates and methylmethacrylate and/or styrene/acrylonitrile. Preferred examples are polymers containing nitrogen heterocycles, including copolymers of N-vinyl pyrrolidone or a derivative thereof and acrylic acid or a derivative thereof, e.g. (meth) acrylic acid. Other examples of the polymeric support matrix compound 102, 402 have the following chemical structures, wherein the elements within the brackets may be repeated:

The support matrix compound 102, 402 may comprise or be an (ethylene-N-Vinylpyrrolidone) copolymer. The (ethylene-N-Vinylpyrrolidone) copolymer may be constituted by derivatives of ethylene and/or N-Vinylpyrrolidone. The (ethylene-N-Vinylpyrrolidone) copolymer may be formed by a polymerisation of N-Vinylpyrrolidone or a derivative thereof and of an ethylenic compound or a derivative of an ethylenic compound with a carbon-carbon double bond. The (ethylene-N-Vinylpyrrolidone) copolymer may be a block copolymer of blocks of polyvinylpyrrolidone or a derivative thereof and blocks of polyethylene or a derivative thereof.

Each of the repetitive units of the polymeric backbone chain of the (ethylene-N-Vinylpyrrolidone) copolymer may have one or more substituents. It is understood that the repetitive units and their substituents are based on the monomers from which the copolymer is formed and on the type of polymerisation. Substituents include groups different from hydrogen atoms. The substituent or the substituents may be an alkylic group or may comprise or be a functional group. The substituents may be positioned on different carbon atoms or on the same carbon atom of the repetitive unit. Substituents may be only present on the ethylene based repetitive units. The substituents on the repetitive unit may have the same or a different chemical structure.

The (ethylene-N-Vinylpyrrolidone) copolymer may have the following chemical structure, wherein the elements within the brackets may be repeated and R, R' and R" may denote repeat units and/or substituents as described above. R" may also be a terminal group formed in the termination reaction of the polymerisation:

Examples for the support matrix compound 102, 402 that are known to complex well with metals are polyimides and polydiynes. Here, complexing is due to the presence of aromatic rings. An example is the following metal-polyimide complex:

Other examples of the support matrix compound 102, 402 may include copolymers that include hydroxyl groups and copolymers that contain both hydroxyl and ionic groups in a copolymer. These types of copolymers may be formed in-situ during the formation of the solid support matrix compound 102, thus preventing the need of a solvent. An example of a hydroxyl terminated precursor to an epoxy resin is epoxidised hydroxyl terminated polybutadiene:

The examples and the individual elements of the support matrix compound 102, 402 as described may be combined in all possible iterations. Thus, the effect of interaction between support matrix compound 102, 402 and organic-inorganic compound 101 may be increased.

Other examples of the support matrix compound are described below in the exemplary compositions and their use is not restricted to these exemplary compositions.

The transparency of the photopolymerisable system 100, 400, 500 may be above 90%. An optical compatibility of the support matrix compound 102, 402 and/or the corresponding precursors with the organic-inorganic compound 101 and the polymer formed thereof 116 may be achieved by using polymeric compatibilisers in small quantities. Thus, low weight molecular block copolymers e.g. A-A-A-B-B-B-A-A-A-type, wherein the monomer of the block copolymer are compatible with the incompatible organic-inorganic compound 101 and the support matrix compound 102, 402, may be included in the photopolymerisable system 100.

To create full colour holograms the photopolymerisation process of the organic-inorganic compound 101 may be equally effectively induced when the organic-inorganic compound 101 is irradiated with red, green and blue lasers. Efficient photopolymerisation when irradiated in all regions of the visible spectrum, hence a controlled change in refractive index, may result in a balanced colour hologram.

To this end sensitising dye may be used that absorb in the visible spectrum and transfer charge or energy to the photoinitiator, which in turn may decompose to free radicals thereby initiating the photopolymerisation of the organic-inorganic compound 101. Further, the sensitising dye and photoinitiator may be two distinct molecular species and the charge or energy transfer may depend on their locality. Therefore, combinations of dye and photoinitiators that have enhanced sensitivity in the visible region and sensitising dye-photoinitiator complexes that are linked by ionic or covalent bonds may be used in the photopolymerisable system.

Examples of such synergistic complexes, which may be used in the photopolymerisable system, may be formed with titanocene and triazine photoinitiators, namely fluorinated diaryl titanocenes and chloromethyl substituted triazines. When used in combination these two photoinitiators may have strong absorbance in the visible spectrum leading to an effective initiation of free radical polymerisation. Furthermore, small additions of halogenated organic materials, such as carbon tetrabromide, eosine, iron arenes and the like may be used to serve for further enhancement of the photosensitivity of the photopolymerisable system. Substituted triazines that may be used in an embodiment include 2-(4-methoxyphenyl-4,6-bis(trichloromethyl)-1,3,5-triazine, 2,4-Bis(trichloromethyl)-6-(p-methoxy)styryl-s-triazine, 2,4-Bis(trichloromethyl)-6-(2,4-dimethoxy)styryl-s-triazine, 2,4-Bis(trichloromethyl)-6-(3,4-dimethoxy)styryl-s-triazine and 2,4,6-tris(trichloromethyl)-1,3,5-triazine. Particularly useful are 2-(4-methoxynapthyl)-4,6-bis(trichloromethyl)-1,3,5-triazine or 2-(4-(2-ethoxyethoxy)napthyl)-4,6-bis(trichloromethyl)-1,3,5-triazine when used in combination with a sensitising dye and a proton donor. Other examples for the photoinitiator, which may be used in the photopolymerisable system, are dye-linked initiators, an example are merocyanine sensitisers covalently linked to bis(trichloromethyl)-1,3,5-triazine by a different number of methylene chains. The linked initiators are in particular suited in the polymerisation of acrylates and other photopolymerisable functional groups.

Other examples for the photoinitiator, which may be used in the photopolymerisable system, the 2-substituted anthraquinones, for example, 2-acrylamidoanthraquinone, 2-acryloxyanthraquinone, 2-benzylaminoanthraquinone and 2-acetoylaminoanthraquinone. This may allow avoiding the use of photosensitizer/photoinitiator combinations.

Depending on the substituent group these photoinitiators encompass absorption and free radical polymerisation over the entire visible spectrum.

Additionally, visible light absorbing photoinitiators, which may be used in the photopolymerisable system, are those comprising derivatives of fluorone dyes of the general Markush formula shown below where I, W, Y, Z, and X being groups determining the properties of the individual compounds:

and dye/Borate V complexes, those that absorb strongly between 600-700 nm are shown below and are commercially available from Spectra Group Inc. i.e.

In one embodiment the photopolymerisable system 100 may comprise as support matrix compound an aromatic acid half ester, which may be solved in 1-Methoxy-2-Propanol (PM) acetate. An example of such a support matrix compound with an aromatic/carboxyl function and forming a high molecular weight prepolymer with low refractive index is Sarbox SB404 (55% in PM acetate) from Sartomer Company. The photopolymerisable system 100 may further comprise as organic-inorganic compound Zirconium bromonorbornanelactone carboxylate triacrylate, which may be used in a solution of mass fraction of 50% in butanol for example available from Pryog Company. Further the photopolymerisable system 100 may comprise as photoinitiator a fluorinated diaryl titanocene, e.g. a photoinitiator of the trade name Irgacure 784 manufactured by Ciba. This photoinitiator absorbs UV and visible light.

Further the photopolymerisable system in this embodiment may comprise a high refractive index monomer different from the organic-inorganic compound for example an ethoxylated Bisphenol A diacrylate, e.g. trade name SR349 from Sartomer Company.

The composition of such a photopolymerisable system may be as a first example,

| | |
|---|---|
| Sarbox SB404 (55% in PM acetate) | 85.0 parts |
| SR 349 | 3.50 parts |
| Zirconium bromonorbornanelactone carboxylate triacrylate (50% in butanol) | 7.0 parts |
| Irgacure 784 | 1.60 parts |
| Acetone | 2.90 parts |
| TOTAL | 100 parts | wherein the term "parts" refer to the mass fraction.

In another embodiment the photopolymerisable system 100 may comprise two different support matrix compounds. For example polyvinyl pyrrolidone, e.g. trade name PVP K90 from International Speciality Products, may be included together with a vinylpyrrolidone/acrylic acid/lauryl methacrylate terpolymer, e.g. trade name Acrylidone LM from International Speciality Products, as support matrix. Latter is an example of a carboxyl functional polymer support that may form a discontinuous or colloidal layer with the following chemical structure (x, y, z are integers representing the repetition of the corresponding element within the brackets):

Further in this embodiment the photopolymerisable system 100 may be the above-identified organic-inorganic compound Zirconium bromonorbornanelactone carboxylate triacrylate, which may as well be used in a solution of mass fraction of 50% in butanol. Further the photopolymerisable system 100 may comprise as photoinitiator as well the above identified fluorinated diaryl titanocene and further 2-(4-(2-ethoxyethoxy)napthyl)-4,6-bis(trichloromethyl)-1,3,5-triazine, which may have a synergistic effect with the fluorinated diaryl titanocene.

Further the photopolymerisable system in this embodiment may comprise a high refractive index, high molecular weight prepolymer different from the organic-inorganic compound for example an ethoxylated Bisphenol A diacrylate. One example is sold by Sartomer Company under the trade name CN 104.

The composition of such a photopolymerisable system may be as a second example,

| | |
|---|---|
| PVP K90 (15% in ethanol) | 34.0 parts |
| Acrylidone LM (15% in ethanol) | 8.50 parts |
| CN 104 | 35.50 parts |
| Zirconium bromonorbornanelactone carboxylate triacrylate (50% in butanol) | 9.750 parts |
| Irgacure 784 | 1.050 parts |
| 2-(4-(2-ethoxyethoxy)napthyl)-4,6-bis(trichloromethyl)-1,3,5-triazine | 0.250 parts |
| Acetone | 10.950 parts |
| TOTAL | 100 parts | wherein the term "parts" refer to the mass fraction.

A hologram recording layer may be prepared by coating the photopolymerisable system with a Meyer bar onto a polyester film substrate, evaporating the solvent to form a film of 20 µm dry thickness. The resulting film may then be checked for refractive index modulation. For photopolymerisable systems forming a film without the substrate the coating on the substrate may be omitted.

Although specific embodiments have been illustrated and described herein, it will be appreciated by those of ordinary skill in the art that a variety of other and/or equivalent implementations may be substituted for the specific embodiments shown and described without departing from the scope of the described embodiments. This application is intended to cover any adaptations or variations of the specific embodiments discussed herein. Therefore, it is intended that this invention be limited only by the claims and the equivalents thereof.

The invention claimed is:

1. A photopolymerisable system, comprising:
an organic-inorganic compound including a first metal and an organic unit having an organic photopolymerisable subunit;
a support matrix compound comprising a copolymer of at least one of N-vinyl pyrrolidone, a derivative of N-vinyl pyrrolidone, acrylic acid, and a derivative of acrylic acid, and at least one of a polyimide and a polydiyne;
wherein the polyimide comprises repeating units of the formula:

a photoinitiator system adapted to initiate the polymerisation of the photopolymerisable subunit; and
wherein the molecules of the organic-inorganic compound are distributed on a molecular level, and
wherein the polyimide and the polydiyne forms a complex with a second metal atom, wherein M is the second metal atom.

2. Photopolymerisable system according to claim 1, further comprising:
a solvent having properties suited to dissolving the organic-inorganic compound.

3. Photopolymerisable system according to claim 1, wherein the photopolymerisable system has a transparency greater than 90%.

4. The photopolymerisable system according to claim 1, wherein the first metal atom is adapted to exhibit attractive forces on the organic-inorganic compound.

5. The photopolymerisable system according to claim 1, wherein the support matrix compound further has any one of a species selected from the group consisting of a covalently bound ionic group, a polar group, and a hydrogen bond forming group; and
wherein the species is adapted to exhibit repulsive forces on the organic-inorganic compound.

6. The photopolymerisable system according to claim 1, wherein the first metal atom is a positively charged metal atom.

7. Photopolymerisable system according to claim 1, wherein the organic-inorganic compound is at least one selected from the group consisting of a metallic acrylate, zinc diacrylate, a derivative of zinc diacrylate, zirconium bromonorbornanelactone carboxylate triacrylate, hafnium bromonorbornanelactone carboxylate triacrylate, hafnium carboxyethylacrylate, zirconium dinorbornane carboxylate diacrylate, zirconium carboxyethylacrylate, a mixture of zirconium bromonorbornanelactone carboxylate triacrylate, hafnium bromonorbornanelactone carboxylate triacrylate, zirconium dinorbornane carboxylate diacrylate and zirconium carboxylate acrylate, and any mixture of metallic acrylate, zinc diacrylate, a zinc containing polyester acrylate, zirconium bromonorbornanelactone carboxylate triacrylate, hafnium carboxyethylacrylate, zirconium dinorbornane carboxylate diacrylate, and zirconium carboxyethylacrylate.

8. Photopolymerisable system according to claim 1, further comprising:
a photopolymerisable monomer or prepolymer different from the organic-inorganic compound;
wherein said photopolymerisable monomer or prepolymer has a diffusion coefficient in said support matrix compound different from the diffusion coefficient of the organic-inorganic compound in said support matrix compound; and
wherein said photopolymerisable monomer or prepolymer has a refractive index different than the refractive index of the organic-inorganic compound.

9. Photopolymerisable system according to claim 1, further comprising:
a UV photoinitiator adapted to initiate a polymerisation reaction of the polymerisable subunits of the organic-inorganic compound and/or the support matrix compound upon exposure of UV light or a visible photoinitiator adapted to initiate a polymerisation reaction of the polymerisable subunits of the organic-inorganic compound and/or the support matrix compound upon exposure to visible light.

10. The photopolymerisable system according to claim 1, wherein the support matrix compound comprises a photocurable polymer adapted to be polymerised and/or crosslinked upon exposure with UV light and/or exposure to heat and/or exposure to plasma.

11. The photopolymerisable system according to claim 1, wherein the support matrix compound comprises a copolymer including repeating units of the following formula wherein x, y, and z are integers.

12. The photopolymerisable system according to claim 1, wherein the support matrix compound comprises a polyimide.

13. The photopolymerisable system according to claim 1, wherein the support matrix compound comprises a metal-polyimide complex.

14. A hologram recording layer comprising the photopolymerisable system according to claim 1.

15. A hologram obtained by at least partially photopolymerising the hologram recording layer according to claim 14.

16. A photopolymerised material obtained by photopolymerising the photopolymerisable system according to claim 1.

17. A method for forming a hologram comprising
generating a film by coating a photopolymerisable system comprising
an organic-inorganic compound including a metal and an organic unit having an organic photopolymerisable subunit,
a support matrix compound comprising a copolymer of at least one of N-vinyl pyrrolidone, a derivative of N-vinyl pyrrolidone, acrylic acid, and a derivative of acrylic acid, and at least one of a polyimide and a polydiyne,
wherein the polyimide comprises repeating units of the formula:

a photoinitiator system adapted to initiate the polymerisation of the photopolymerisable subunit,
wherein the molecules of the organic-inorganic compound are distributed on a molecular level on a substrate, and
illuminating said film with an object beam and a reference beam,
wherein said object beam is directed from an object towards said sample and said object beam and said reference beam are temporally and spatially overlapping at the position of the sample; and
wherein the polyimide and the polydiyne forms a complex with a second metal atom wherein M is the second metal atom.

* * * * *